US012787672B2

(12) United States Patent
Chen et al.

(10) Patent No.: US 12,787,672 B2
(45) Date of Patent: Nov. 3, 2026

(54) METHOD OF MANUFACTURING METAL INTERCONNECTION LINE BASED ON GRADIENT OVER-ETCH AND AMMONIUM FLUORIDE TREATMENT AND METAL INTERCONNECTION LINE

(71) Applicant: CANSEMI TECHNOLOGY INC., Guangdong (CN)

(72) Inventors: Zhongkui Chen, Guangdong (CN); Fanshun Meng, Guangdong (CN)

(73) Assignee: CANSEMI TECHNOLOGY INC., Guangdong (CN)

( * ) Notice: Subject to any disclaimer, the term of this patent is extended or adjusted under 35 U.S.C. 154(b) by 0 days.

(21) Appl. No.: 18/994,222

(22) PCT Filed: Dec. 27, 2023

(86) PCT No.: PCT/CN2023/142195

§ 371 (c)(1),
(2) Date: Jan. 14, 2025

(87) PCT Pub. No.: WO2024/164749

PCT Pub. Date: Aug. 15, 2024

(65) Prior Publication Data

US 2026/0005033 A1 Jan. 1, 2026

(30) Foreign Application Priority Data

Feb. 8, 2023 (CN) ........................ 202310076788.3

(51) Int. Cl.
*H10P 50/26* (2026.01)

(52) U.S. Cl.
CPC .................................. *H10P 50/266* (2026.01)

(58) Field of Classification Search
CPC ............................ H10P 50/266; H10P 70/273
(Continued)

(56) References Cited

U.S. PATENT DOCUMENTS 6,197,388 B1 3/2001 Choi et al.
6,472,329 B1 * 10/2002 Goto .................... H10P 50/267 438/720
(Continued)

FOREIGN PATENT DOCUMENTS

CN 1630042 A 6/2005
CN 101285189 A 10/2008
(Continued)

*Primary Examiner* — David Chen
(74) *Attorney, Agent, or Firm* — MUNCY, GEISSLER, OLDS & LOWE, P.C.

(57) ABSTRACT

The present invention provides a metal interconnection line and a method of manufacturing the same. The method includes: providing a wafer on which a metal layer comprising an Al layer is formed; performing an ME process on the Al layer using a chlorine-containing gas, thereby removing a partial thickness of the Al layer and producing $AlCl_3$; performing a gradient OE process on the remainder of the Al layer using the chlorine-containing gas and a fluorine-containing gas, thereby removing an undesired part of the remainder of the Al layer and forming an Al interconnection line, wherein in the gradient OE process, a proportion of the fluorine-containing gas is increased stepwise to exchange the $AlCl_3$ for $AlF_3$; and soaking the wafer in an $NH_4F$ solution to remove the $AlF_3$. According to the present invention, Cl— ions remaining on the surface of the Al interconnection line from the etching processes for forming the line can be completely removed, preventing corrosion of the Al interconnection line.

12 Claims, 2 Drawing Sheets

(58) Field of Classification Search
USPC .................................................. 438/712, 714
See application file for complete search history.

(56) References Cited

U.S. PATENT DOCUMENTS

| | | | | |
|---|---|---|---|---|
| 2009/0032091 | A1* | 2/2009 | Huang | H10F 10/17 136/252 |
| 2016/0099173 | A1* | 4/2016 | Agarwal | H01J 37/321 438/714 |
| 2021/0119128 | A1* | 4/2021 | Zhang | H10D 30/6729 |
| 2025/0126923 | A1* | 4/2025 | Meng | C30B 31/185 |

FOREIGN PATENT DOCUMENTS

| | | | | | |
|---|---|---|---|---|---|
| CN | 101380636 | A | | 3/2009 | |
| CN | 105977149 | A | | 9/2016 | |
| CN | 106148960 | A | | 11/2016 | |
| CN | 107346732 | A | | 11/2017 | |
| CN | 107706089 | A | | 2/2018 | |
| CN | 109461743 | A | | 3/2019 | |
| CN | 110634739 | A | | 12/2019 | |
| CN | 110867389 | A | * | 3/2020 | H10W 72/019 |
| CN | 115799172 | A | | 3/2023 | |
| JP | 2008144195 | A | * | 6/2008 | |
| JP | 2010045204 | A | * | 2/2010 | |

* cited by examiner

METHOD OF MANUFACTURING METAL INTERCONNECTION LINE BASED ON GRADIENT OVER-ETCH AND AMMONIUM FLUORIDE TREATMENT AND METAL INTERCONNECTION LINE

TECHNICAL FIELD

The present invention relates to the field of integrated circuit fabrication processes and technology, and particularly to a metal interconnection line and a method of manufacturing the same.

BACKGROUND

In integrated circuit fabrication processes, aluminum (Al) is often used to make metal interconnection lines. Al etching is one of the major etching processes in the field of semiconductor chip manufacturing and essentially involves the following steps: breakthrough (BT), main etch (ME), over etch (OE) and purge/pump (PP).

BT: In an Al etching process, the Al surface is extremely easy to spontaneously oxidize, forming a layer of alumina ($Al_2O_3$) which hinders the etching progress at an early phase by blocking chlorine ($Cl_2$) from coming into contact with Al. Accordingly, physical bombardment with boron trichloride ($BCl_3$) and the reaction between $BCl_3$ and $Al_2O_3$, as given in Eqn. 1 below, which gives rise to a volatile polymer, are typically employed to remove the natural surface $Al_2O_3$ layer.

$$Al_2O_3 + 3BCl_3 \rightarrow 2AlCl_3 + 3BOCl \quad \text{Eqn. 1}$$

ME: $Cl_2$ and $BCl_3$ gases are then used as an etchant to perform an ME step on the Al surface, in which $Cl_2$ chemically reacts with Al to produce volatile aluminum chloride ($AlCl_3$), which is then blown away from the reactor chamber by a stream of gas. $BCl_3$ provides $$BCl_3^+$$

ions, which vertically bombard and anisotropically etch the Al surface. Meanwhile, it reacts away oxides immediately after they are formed, as expressed in Eqn. 2 below, facilitating continued progress of the etching process:

$$BCl_3 \rightarrow BCl_2 + Cl^* \quad \text{Eqn. 2}$$

$$BCl_3 \rightarrow BCl_3^+ + e^-$$

$$Cl_2 \rightarrow Cl^* + Cl^*$$

$$3Cl^* + Al^* \rightarrow AlCl_3.$$

OE: The etching process continues to etch away undesired Al that remains from the ME step typically in a small amount, as well as a barrier layer.

In the ME and OE steps, in order to prevent $Cl_2$ from laterally etching side surfaces and bottom portions of the Al lines being formed, which may lead to void defects in the surfaces and portions, gaseous $CH_4$ is usually introduced to the etching chamber to react with photoresist to produce polymers, which are deposited on the side surfaces and bottom portions of the metal lines and form a protective layer thereon against lateral etching of $Cl_2$. A greater Al thickness, or a thicker $Al_2O_3$ layer to be removed requires a longer etching time and more gaseous $CH_4$ to be introduced to form a thicker protective polymer layer.

PP: During the reactions, trace fine particulate impurities may be mixed into the plasma. In order to prevent such particulate impurities from dropping onto the wafer as the plasma disappears after the completion of the reactions, the supply of power is continued to maintain the plasma for a short additional period of time after the etching reactions are complete, and an amount of gas is pumped into the etching chamber to purge away the particles along with part of the by-products of the reactions. This ensures that the chamber is returned to the initial state and ready for the next wafer etching cycle.

However, after the Al etching process is completed, $AlCl_3$ remaining on the wafer surface and side walls of the resulting pattern will self-circulate by reacting with moisture in the air, as described in Eqn. 3 below, causing serious Al corrosion:

$$AlCl_3 + 3H_2O \rightarrow Al(OH)_3 + 3HCl \quad \text{Eqn. 3}$$

$$2Al + 6HCl \rightarrow 2AlCl_3 + 3H_2.$$

Additionally, chloride ($Cl^-$) ions adsorbed on the Al and wafer surfaces may be exposed to the atmosphere or a moisture-containing environment in a subsequent process. When this happens, such $Cl^-$ ions can react with moisture at room temperature under atmospheric pressure to give rise to hydrogen chloride (HCl, as shown in Eqn. 4 below), thus exacerbating corrosion of the resulting Al lines and eventually lead to product quality problems in terms of reliability.

$$Cl^- + H_2O \rightarrow OH^- + HCl \quad \text{Eqn. 4}$$

$$2Al + 6HCl \rightarrow 2AlCl_3 + 3H_2.$$

To overcome these, water ($H_2O$) and oxygen ($O_2$) plasma is typically used after the completion of the etching process to remove chlorides and the photoresist and form a layer of $Al_2O_3$ over the Al surface to protect the underlying Al. Additionally, the wafer is immediately washed with a hydroxylamine-containing organic solvent to remove $AlCl_3$ and $Cl^-$ ions from the Al surface.

As the demand for higher chip integration and performance ever grows, Al interconnection lines with a larger height-to-width aspect ratio are increasingly required. For many analog circuit and power management chips, Al lines in the topmost metal wiring layer are required to a thickness of 4 μm or more, as well as an extremely small width and line-to-line pitch. For example, in regions with dense lines, the lines may be required to be spaced at a pitch of 1.5 μm or less. Such narrow, thick Al lines pose great challenges to the etching processes used to make them, because it is difficult to achieve a satisfactory tradeoff between the need for a greater amount of polymers in the OE step for preventing void defects that may be formed in lower portions of the metal lines being formed and the need for minimizing the presence of chlorine-containing polymers which may lead to corrosion defects. Currently, there are two approaches available for preventing corrosion of Al lines. The first approach is to thoroughly clean off $Cl^-$ ions remaining from Al etching. The second approach is to deposit a moisture-isolating silicon dioxide ($SiO_2$) layer. However, for chip regions in which dense lines having a high depth-to-width aspect ratio and spaced at a small line-to-line pitch are to be formed, it would be difficult to clean off $AlCl_3$ and adsorbed $Cl^-$ ions from the bottom of gaps between lines, and $SiO_2$ would show only limited step coverage for such patterns. Moreover, under the influence of stress, cracks tend to develop at corners, manufacturing it impossible to completely isolate Al lines from the atmosphere or moisture and leaving a chance for corrosion of them.

In order to thoroughly clean off residual $Cl^-$ ions from a wafer that has undergone a dry etching process for forming Al lines, some have proposed an approach involving: a pre-treatment on the wafer using deionized water for removing chlorine-containing residues; then washing the pre-treated wafer with a fluorine-based solution containing ammonium fluoride ($NH_4F$); and a post-treatment on the washed wafer using deionized water for removing fluorine-containing residues. Despite enhanced corrosion-resistance of Al lines, this approach is disadvantageous in that, during the pre-treatment on the wafer surface directly using deionized water, poly-aluminum chloride produced during the dry etching can react with deionized water, resulting in self-circulation, as shown in Eqn. 3 and corrosion of Al lines.

It has been also proposed to introduce a purge gas to the chamber, in which the dry etching process for forming Al lines is carried out, to flush away most of $AlCl_3$, followed by evacuation of most of the gas. A fluorine-containing gas is then introduced and energized and ionized to produce fluorine ($F^-$) ions, which exchange $Cl^-$ ions from $AlCl_3$, allowing the $Cl^-$ ions to be removed. Although this approach provides prevention against corrosion of Al lines, it is still associated with a number of drawbacks. After Al lines are formed in the dry etching process, in particular at a high density with a large depth-to-width aspect ratio, their side walls are covered with a large amount of polymers, which impedes the F ions produced from the fluorine-containing gas from access to $Cl^-$ ions adsorbed on the surface of the Al lines. Consequently, such $Cl^-$ ions cannot be effectively replaced, manufacturing complete prevention of Al line corrosion impossible.

Therefore, how to completely remove $Cl^-$ ions remaining on the surface of Al interconnection lines formed by etching, which may lead to corrosion of the Al interconnection lines, remains a problem requiring urgent resolution.

SUMMARY

It is an objective of the present invention to provide a metal interconnection line and a method of manufacturing the same, which can completely remove $Cl^-$ ions remaining on the surface of Al interconnection lines formed by etching and thereby prevent corrosion of the Al interconnection lines.

To this end, the present invention provides a method of manufacturing a metal interconnection line, which includes:

providing a wafer on which a metal layer including an aluminum (Al) layer is formed;

performing a main etch (ME) process on the Al layer using a chlorine-containing gas, thereby removing a partial thickness of the Al layer and producing aluminum chloride ($AlCl_3$);

performing a gradient over etch (OE) process on the remainder of the Al layer using the chlorine-containing gas and a fluorine-containing gas, thereby removing an undesired part of the remainder of the Al layer and forming an Al interconnection line, wherein in the gradient OE process, a proportion of the fluorine-containing gas is increased stepwise to exchange the $AlCl_3$ for aluminum fluoride ($AlF_3$); and soaking the wafer in an ammonium fluoride ($NH_4F$) solution to remove the $AlF_3$.

Preferably, the chlorine-containing gas includes boron trichloride ($BCl_3$) and chlorine ($Cl_2$).

Preferably, the fluorine-containing gas includes carbon tetrafluoride ($CF_4$) and/or trifluoromethane ($CHF_3$).

Preferably, before the ME process is performed on the Al layer using the chlorine-containing gas, the method further includes:

forming an anti-reflective layer on the metal layer;

forming a photoresist layer on the anti-reflective layer;

patterning the photoresist layer by performing a photolithography process;

with the patterned photoresist layer serving as a mask, etching the anti-reflective layer and a natural alumina ($Al_2O_3$) layer on a surface of the Al layer.

Preferably, after the gradient OE process is performed on the remainder of the Al layer using the chlorine-containing gas and the fluorine-containing gas, and before the wafer is soaked in the $NH_4F$ solution, the method further includes:

removing the patterned photoresist layer.

Preferably, performing the gradient OE process on the remainder of the Al layer using the chlorine-containing gas and the fluorine-containing gas includes:

performing a first OE stage at a flow rate of the fluorine-containing gas, which is ¼ to ⅓ of a flow rate of the chlorine-containing gas, for a time period accounting for ¼ to ⅓ of a total duration of the gradient OE process;

performing a second OE stage at a flow rate ratio of 1:1 to 2:1 of the fluorine-containing gas to the chlorine-containing gas for a time period accounting for ⅓ to ½ of the total duration of the gradient OE process;

performing a third OE stage at a flow rate ratio of 3:1 to 5:1 of the fluorine-containing gas to the chlorine-containing gas until the undesired part of the remainder of the Al layer is removed and the Al interconnection line is formed; and stopping introducing the chlorine-containing gas and continuing to introduce the fluorine-containing gas, thereby exchanging the $AlCl_3$ for aluminum fluoride ($AlF_3$) and producing gaseous volatile hydrogen chloride (HCl).

Preferably, before the wafer is soaked in the $NH_4F$ solution, the method further includes:

removing the gaseous volatile HCl and byproducts from reactions that occur in the gradient OE process using an extraction pump.

Preferably, after the wafer is soaked in the $NH_4F$ solution, the method further includes:

washing the wafer with deionized water.

Preferably, after the wafer is washed with deionized water, the method further includes:

drying the wafer with indolepropionic acid (IPA).

Preferably, the metal layer further includes a titanium (Ti)/titanium nitride (TiN) layer formed between the wafer and the Al layer and a TiN layer formed on the Al layer, wherein the TiN layer is etched before the ME process is performed on the Al layer using the chlorine-containing gas, and the Ti/TiN layer is etched after the gradient OE process is performed on the remainder of the Al layer using the chlorine-containing gas and the fluorine-containing gas.

The present invention also provides a metal interconnection line made in accordance with the method as defined above. Compared with the prior art, the present invention provides the benefits as follows:

1. It provides a method manufacturing a metal interconnection line, which includes: providing a wafer on which a metal layer including an Al layer is formed; performing an ME process on the Al layer using a chlorine-containing gas, thereby removing a partial thickness of the Al layer and producing $AlCl_3$; performing a gradient OE process on the remainder of the Al layer using the chlorine-containing gas and a fluorine-containing gas, thereby removing an undesired part of the remainder of the Al layer and forming an Al interconnection line, wherein in the gradient OE process, a proportion of the fluorine-containing gas is increased stepwise to exchange the $AlCl_3$ for $AlF_3$; and soaking the wafer in an $NH_4F$ solution to remove the $AlF_3$. This method can completely remove $Cl^-$ ions remaining on the surface of the Al interconnection line from the etching processes and thereby prevent corrosion of the Al interconnection line.

2. It provides a metal interconnection line made in accordance with the above method. Since the method can completely remove $Cl^-$ ions remaining on the surface of the Al interconnection line from etching, corrosion of the Al interconnection line is prevented.

DETAILED DESCRIPTION

Objectives, features and advantages of the present invention will become more apparent upon reading the following description with reference to the accompanying drawings, which illustrates metal interconnection lines and methods of manufacturing the same according to particular embodiments thereof. Note that the figures are provided in a very simplified form not necessarily drawn to exact scale for the only purpose of helping to explain the disclosed embodiments in a more convenient and clearer way. In addition, the illustrated structures are usually part of their real-world counterparts. In particular, as the figures tend to have distinct emphases, they are sometimes drawn to different scales.

Figure 1:
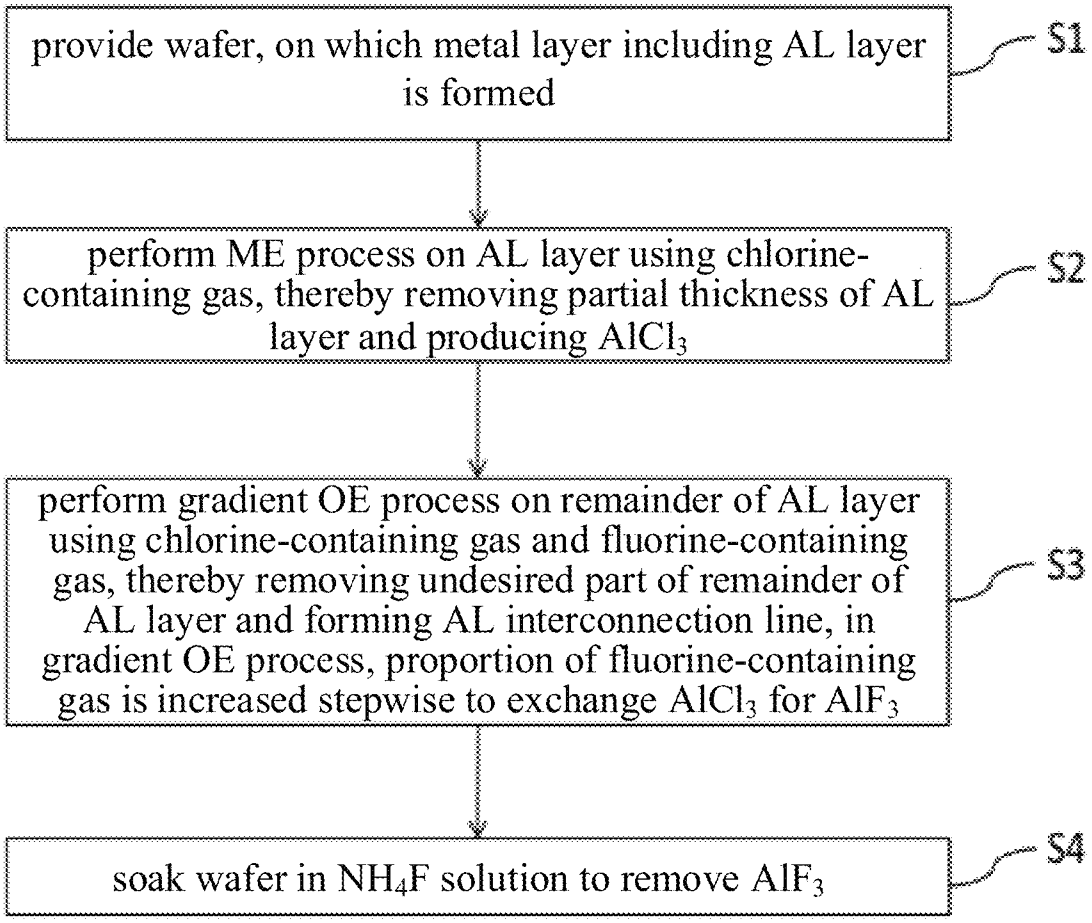
FIG. 1 shows a flow chart of a method of manufacturing a metal interconnection line according to an embodiment of the present invention.

In one embodiment of the present invention, there is provided a method of manufacturing a metal interconnection line. Referring to FIG. 1, the method of manufacturing the metal interconnection line includes:

in step S1, providing a wafer, on which a metal layer including an aluminum (Al) layer is formed;

in step S2, performing a main etch (ME) process on the Al layer using a chlorine-containing gas, thereby removing a partial thickness of the Al layer and producing aluminum chloride ($AlCl_3$);

in step S3, performing a gradient over etch (OE) process on the remainder of the Al layer using the chlorine-containing gas and a fluorine-containing gas, thereby removing an undesired part of the remainder of the Al layer and forming an Al interconnection line, wherein in the gradient OE process, the proportion of the fluorine-containing gas is increased stepwise to exchange the $AlCl_3$ for aluminum fluoride ($AlF_3$); and in step S4, soaking the wafer in an ammonium fluoride ($NH_4F$) solution to remove the $AlF_3$.

The method of manufacturing the metal interconnection line of this embodiment is described in greater detail below.

In step S1, a wafer is provided and a metal layer is deposited on the wafer, the metal layer including an Al layer.

The metal layers may include only the Al layer, or the Al layer, titanium (Ti)/titanium nitride (TiN) layer formed between the wafer and the Al layer and a TiN layer on the Al layer.

Step S1 includes providing the wafer first, which may include a substrate and an insulating layer residing on the substrate and containing conductive plugs. The metal layer is then deposited on the insulating layer so as to be electrically connected to the conductive plugs. The metal layer may include an Al layer. Alternatively, the metal layer may include an Al layer, a Ti/TiN layer between the insulating layer and the Al layer and a TiN layer on the Al layer.

The metal layer may have a thickness of 1 μm to 5 μm.

In step S2, a chlorine-containing gas is used to perform an ME process on the Al layer, thereby removing a partial thickness of the Al layer and producing $AlCl_3$.

Preferably, before the chlorine-containing gas is used to perform the ME process on the Al layer, the method may further include: first forming an anti-reflective layer on the metal layer; then coating a photoresist layer on the anti-reflective layer; next, performing a photolithography process, in which exposure and development are conducted using a photomask to pattern the photoresist layer; and subsequently, with the patterned photoresist layer serving as a mask, etching the anti-reflective layer and a natural $Al_2O_3$ layer on the surface of the Al layer.

The photoresist layer may have a thickness of 3 μm to 6 μm, and the photoresist layer may allow a line width and a minimum possible line pitch both of 1 μm and a height-to-width aspect ratio of up to 4:1.

Since a surface portion of the Al layer is extremely easy to oxidize to a natural $Al_2O_3$ layer, after the anti-reflective layer is etched through, the etching process may further proceed through the natural $Al_2O_3$ layer on the Al layer surface, preventing the natural $Al_2O_3$ layer from impeding access of the chlorine-containing gas to the Al layer in the subsequent ME process for etching the Al layer using the chlorine-containing gas.

The anti-reflective layer and the natural $Al_2O_3$ layer may be etched using argon (Ar), trifluoromethane ($CHF_3$), chlorine ($Cl_2$) and boron trichloride ($BCl_3$) introduced to the etching chamber. Parameters of this etching process may be set according to the thickness of the anti-reflective layer to be etched.

In case of the metal layer further including a TiN layer on the Al layer, before the ME process is performed on the Al layer using the chlorine-containing gas, the TiN layer may also be etched with the patterned photoresist layer as a mask.

Preferably, the chlorine-containing gas includes $BCl_3$ and $Cl_2$, with $Cl_2$ dominating. In the ME process performed on the Al layer using the chlorine-containing gas with the patterned photoresist layer serving as a mask, the chlorine-containing gas chemically reacts with the Al layer, producing $AlCl_3$ as a volatile byproduct. This process is a dry etching process for removing a partial thickness of the Al layer. Moreover, in this etching process, $BCl_3$ provides $BCl_3^+$ ions and electrons, which directly bombard the surface of the Al layer vertically and thus etch the layer anisotropically. At the same time, $BCl_3$ reacts with the natural oxide layer on the Al layer surface, enabling progress of the etching process. It should be noted that the chlorine-containing gas is not limited to the composition described above, and any suitable composition may be selected depending on desired etching results of the Al layer.

The ME process may be carried out on the Al layer using the chlorine-containing gas at a temperature of 40° C. to 60° C., a $Cl_2$ flow rate in the range of 200 sccm to 500 sccm and a $BCl_3$ flow rate in the range of 50 sccm to 150 sccm. The ME process may be stopped when the Al layer being etched is detected as reaching a desired thickness.

In step S3, a gradient OE process is performed on the remainder of the Al layer using the chlorine-containing gas and a fluorine-containing gas to remove an undesired part of the remainder of the Al layer, forming an Al interconnection line. In the gradient OE process, the proportion of the fluorine-containing gas is increased step by step to exchange the $AlCl_3$ for $AlF_3$. The gradient OE process may be performed on the remainder of the Al layer using the chlorine- and fluorine-containing gases using the patterned photoresist layer as a mask.

Preferably, the fluorine-containing gas may include carbon tetrafluoride ($CF_4$) and/or trifluoromethane ($CHF_3$). It should be noted that the fluorine-containing gas is not limited to being so composed, and any suitable composition may be selected depending on how $Cl^-$ ions actually react with the fluorine-containing gas.

In the ME process, the chlorine-containing gas reacts with the Al layer to simultaneously produce large amounts of $AlCl_3$ and $Cl^-$ ions. The $Cl^-$ ions tend to be adsorbed on, and cause corrosion of, the Al layer surface. The fluorine-containing gas can react with the $Cl^-$ ions adsorbed on the Al layer surface to exchange them for $F^-$ ions, producing volatile hydrogen chloride (HCl) and turning $AlCl_3$ to aluminum fluoride ($AlF_3$). The resulting volatile HCl can be discharged from the etching chamber, mitigating corrosion of the Al layer surface.

The gradient OE process deals principally with the remaining Al layer and the natural $Al_2O_3$ layer on the Al layer surface. If required, the OE process may be divided into multiple stages to create a gradient. After step S2, the chlorine-containing gas continued to be introduced, and the fluorine-containing gas is additionally introduced at increasing proportions in said stages. In the gradient OE process, $Cl^-$ ions in $AlCl_3$ and on the Al layer surface can be effectively exchanged for F ions, and as the remainder of the Al layer and the natural $Al_2O_3$ layer are gradually removed, the proportion of the fluorine-containing gas is gradually increased, ensuring both that more polymers are formed to protect the morphology of the Al layer and that an excess of $F^-$ ions is present to enable $Cl^-$ ions in $AlCl_3$ and on the Al layer surface to be completely exchanged and converted into gaseous volatile HCl. Since the Al layer are extremely easy to naturally oxidize to $Al_2O_3$ when exposed to the air, in the gradient OE process, the $BCl_3$ is used to bombard and remove the natural $Al_2O_3$ layer on the Al layer surface.

Preferably, the gradient OE process performed on the remainder of the Al layer using the chlorine- and fluorine-containing gases with the patterned photoresist layer serving as a mask includes a first OE stage, in which the chlorine-containing gas continues to be introduced to the etching chamber, and at the same time, the fluorine-containing gas is also introduced into the etching chamber at a low flow rate proportion to the chlorine-containing gas, which is preferred to be ¼ to ⅓. Preferably, the first OE stage accounts for ¼ to ⅓ of the total duration of the gradient OE process. A second OE stage follows, in which both the chlorine- and fluorine-containing gases continue to be introduced to etch the remainder of the Al layer. In this stage, the flow rate of the chlorine-containing gas is decreased, while the flow rate of the fluorine-containing gas is increased, preferably raising the flow rate ratio to 1:1 to 2:1. Preferably, the second OE stage accounts for ⅓ to ½ of the total duration of the gradient OE process. The gradient OE process also includes a third OE stage, in which the flow rate of the chlorine-containing gas is further decreased, and the flow rate of the fluorine-containing gas is additionally increased. Preferably, the flow rate ratio of the fluorine-containing gas to the chlorine-containing gas is thus further increased to 3:1 to 5:1 and maintained until the undesired part of the remainder of the Al layer is removed, resulting in the formation of the Al interconnection line. After that, the chlorine-containing gas is no longer introduced, while the introduction of the fluorine-containing gas is continued. As a result, F ions are present at an excess, ensuring complete exchange of $Cl^-$ ions in $AlCl_3$ and on the Al layer surface, producing $AlF_3$ and gaseous volatile HCl.

It should be noted that the duration and flow rate proportions of the gradient OE stages are not limited to lying in the above ranges, and may vary in other embodiments depending on the thickness of the Al layer actually to be etched.

In case of the metal layer further including a Ti/TiN layer between the wafer and the Al layer, after the gradient OE process performed on the remainder of the Al layer using the chlorine- and fluorine-containing gases is completed, the Ti/TiN layer may be etched.

In step S4, the wafer is soaked in an $NH_4F$ solution to remove the $AlF_3$ from the Al layer surface.

Preferably, before the wafer is soaked in the $NH_4F$ solution, the method further includes removing the gaseous volatile HCl and byproducts of reactions that occur in the gradient OE process using an extraction pump. In this way, the gaseous volatile HCl produced from exchange of Cl– ions on the Al layer surface for F– ions from the fluorine-containing gas during the gradient OE process is removed by the extraction pump, eliminating the chance for corrosion of the Al layer due to such Cl– ions and providing sound protection to the Al layer. Furthermore, removing other gases and easily removable byproducts from the reactions from the etching chamber using the extraction pump can clean the Al layer, facilitating its subsequent processing.

Preferably, after the extraction pump is used to remove the gaseous volatile HCl and the byproducts of reactions that occur in the gradient OE process, and before the wafer is soaked in the $NH_4F$ solution, the method further includes completely removing the patterned photoresist layer that is formed prior to the etching of the Al layer. This additionally facilitates subsequent processing of the Al layer.

Preferably, after the wafer is soaked in the $NH_4F$ solution, the method further includes washing the wafer with deionized water.

Preferably, after the wafer is washed with deionized water, the method further includes drying the wafer with indolepropionic acid (IPA).

The $AlF_3$ from the reaction between the fluorine-containing gas and the $AlCl_3$ in the gradient OE process is a non-volatile, chemically stable ionic compound, which can be barely pumped away from the etching chamber. However, this compound easily reacts with $NH_4F$ to form water-soluble ammonium tetrafluoroaluminate ($NH_4AlF_4$). Therefore, when the wafer is soaked in the $NH_4F$ solution, the poly-aluminum chloride formed on the Al layer on the wafer during the gradient OE process is dissolved. After the poly-aluminum chloride on the wafer surface is dissolved, the wafer may be washed with a large amount of deionized water and then dried to completely remove $NH_4AlF_4$ and F ions from the wafer surface. Thus, both $Cl^-$ and $F^-$ ions are removed from the Al layer surface, preventing corrosion of the Al layer and void defects in a lower portion of the resulting Al line that may occur due to polymers deposited thereon.

In summary, the present invention provides a method of manufacturing a metal interconnection line, which includes: providing a wafer, on which a metal layer including an Al layer is formed; performing an ME process on the Al layer using a chlorine-containing gas, thereby removing a partial thickness of the Al layer and producing $AlCl_3$; performing a gradient OE process on the remainder of the Al layer using the chlorine-containing gas and a fluorine-containing gas, thereby removing an undesired part of the remainder of the Al layer and forming an Al interconnection line, wherein in the gradient OE process, the proportion of the fluorine-containing gas is increased stepwise to exchange the $AlCl_3$ for $AlF_3$; and soaking the wafer in an $NH_4F$ solution to remove the $AlF_3$. This method can completely remove $Cl^-$ ions remaining on the surface of the Al interconnection line formed from the etching processes and thereby prevent corrosion of the Al interconnection line.

The present invention also provides a metal interconnection line obtainable according to the method discussed above.

The metal interconnection line is described in greater detail below with reference to FIGS. 2 to 3.

For details of the method, reference is made to the above description, and it is not repeated here.

In one embodiment of the present invention, first of all, a wafer is provided and a metal layer is deposited on the wafer. Subsequently, an anti-reflective layer is formed on the metal layer, and a photoresist layer is coated on the anti-reflective layer. Next, the photoresist layer is patterned by exposing it using a photomask and then developing it. Afterwards, with the patterned photoresist layer serving as a mask, an ME process using a chlorine-containing gas is carried out on the Al layer. In this process, $AlCl_3$ and a large amount of $Cl^-$ ions are formed on the surface of the Al layer. A gradient OE process using the chlorine-containing gas and a fluorine-containing gas is employed to etch the remainder of the Al layer and remove the $Cl^-$ ions from the Al layer surface. Subsequently, an extraction pump is used to remove HCl and other gases and easily removable byproducts resulting from the reactions that occur in the process from the etching chamber. The photoresist layer coated on the Al layer surface is removed by in-situ stripping. Afterwards, the wafer is soaked in an $NH_4F$ solution and then washed with deionized water, removing poly-aluminum chloride from the Al layer surface. At last, the wafer is dried with IPA, and an Al interconnection line is obtained. Compared with Al interconnection lines formed using conventional dry etching processes, the Al interconnection line obtained according to the proposed method is free of $Cl^-$ ions on its surface and somewhat corrosion-resistant.

Figure 2:
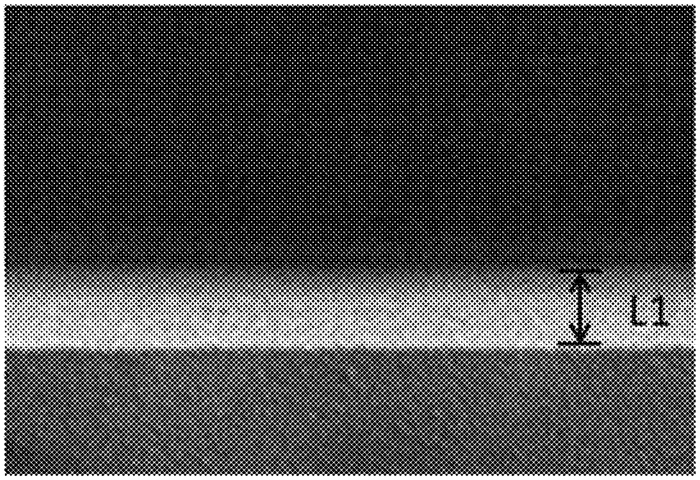
FIG. 2 shows an SEM photograph of an Al interconnection line made according to the method of FIG. 1.
Figure 3:
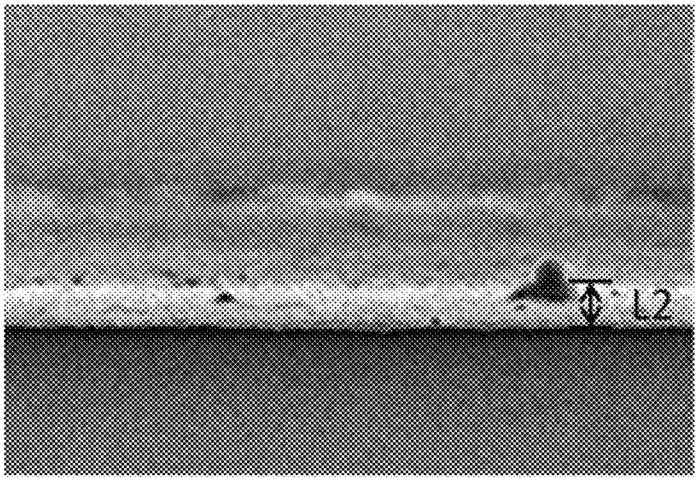
FIG. 3 shows an SEM photograph of an Al interconnection line made according to a different method from that of FIG. 1.

Reference is now made to FIG. 2, an SEM photograph of an Al interconnection line made according to the inventive method, and FIG. 3, an SEM photograph of an Al interconnection line made according to a different method. As revealed by a comparison made between FIGS. 2 and 3, several hours later, considerable corrosion defects were observed on side walls of the Al interconnection line L2 made according to the other method, while the Al interconnection line L1 made according to the inventive method still had smooth, flat edges without noticeable corrosion defects. This demonstrates effective corrosion-resistance of the Al interconnection line obtained according to the proposed method.

In summary, the present invention provides a metal interconnection line obtainable according to the method of the invention. Since the method can completely remove CI-ions remaining on the surface of the Al interconnection line from etching, corrosion of the Al interconnection line is prevented.

The description presented above is merely that of a few preferred embodiments of the present invention and is not intended to limit the scope thereof in any sense. Any and all changes and modifications made by those of ordinary skill in the art based on the above teachings fall within the scope of the invention.

The invention claimed is:

1. A method of manufacturing a metal interconnection line, comprising:

providing a wafer on which a metal layer is formed, the metal layer comprising an aluminum (Al) layer;

performing a main etch process on the Al layer using a chlorine-containing gas, thereby removing a partial thickness of the Al layer and producing aluminum chloride ($AlCl_3$);

performing a gradient over etch (OE) process on a remainder of the Al layer using the chlorine-containing gas and a fluorine-containing gas, thereby removing an undesired part of the remainder of the Al layer and forming an Al interconnection line, wherein in the gradient OE process, a proportion of the fluorine-containing gas is increased stepwise to exchange the $AlCl_3$ for aluminum fluoride ($AlF_3$); and soaking the wafer in an ammonium fluoride ($NH_4F$) solution to remove the $AlF_3$, wherein performing the gradient OE process on the remainder of the Al layer using the chlorine-containing gas and the fluorine-containing gas comprises:

performing a first OE stage at a flow rate of the fluorine-containing gas, which is ¼ to ⅓ of a flow rate of the chlorine-containing gas, for a time period accounting for ¼ to ⅓ of a total duration of the gradient OE process;

performing a second OE stage at a flow rate ratio of 1:1 to 2:1 of the fluorine-containing gas to the chlorine-containing gas for a time period accounting for ⅓ to ½ of the total duration of the gradient OE process;

performing a third OE stage at a flow rate ratio of 3:1 to 5:1 of the fluorine-containing gas to the chlorine-containing gas until the undesired part of the remainder of the Al layer is removed and the Al interconnection line is formed; and stopping introducing the chlorine-containing gas and continuing to introduce the fluorine-containing gas, thereby exchanging the $AlCl_3$ for aluminum fluoride ($AlF_3$) and producing gaseous volatile hydrogen chloride (HCl).

2. The method of manufacturing the metal interconnection line of claim 1, wherein the chlorine-containing gas comprises boron trichloride ($BCl_3$) and chlorine ($Cl_2$).

3. The method of manufacturing the metal interconnection line of claim 1, wherein the fluorine-containing gas comprises carbon tetrafluoride ($CF_4$) and/or trifluoromethane ($CHF_3$).

4. The method of manufacturing the metal interconnection line of claim 1, wherein before the main etch process is performed on the Al layer using the chlorine-containing gas, the method of manufacturing the metal interconnection line further comprising:

forming an anti-reflective layer on the metal layer;

forming a photoresist layer on the anti-reflective layer;

patterning the photoresist layer by performing a photolithography process; and with the patterned photoresist layer serving as a mask, etching the anti-reflective layer and a natural alumina ($Al_2O_3$) layer on a surface of the Al layer.

5. The method of manufacturing the metal interconnection line of claim 4, wherein after the gradient OE process is performed on the remainder of the Al layer using the chlorine-containing gas and the fluorine-containing gas, and before the wafer is soaked in the $NH_4F$ solution, the method of manufacturing the metal interconnection line further comprising:

removing the patterned photoresist layer.

6. The method of manufacturing the metal interconnection line of claim 1, wherein before the wafer is soaked in the $NH_4F$ solution, the method of manufacturing the metal interconnection line further comprising:

removing the gaseous volatile HCl and byproducts from reactions that occur in the gradient OE process using an extraction pump.

7. The method of manufacturing the metal interconnection line of claim 1, wherein after the wafer is soaked in the $NH_4F$ solution, the method of manufacturing the metal interconnection line further comprising:

washing the wafer with deionized water.

8. The method of manufacturing the metal interconnection line of claim 7, wherein after the wafer is washed with deionized water, the method of manufacturing the metal interconnection line further comprising:

drying the wafer with indolepropionic acid (IPA).

9. The method of manufacturing the metal interconnection line of claim 1, wherein the metal layer further comprises a titanium (Ti)/titanium nitride (TiN) layer formed between the wafer and the Al layer and a TiN layer formed on the Al layer, wherein the TIN layer is etched before the main etch process is performed on the Al layer using the chlorine-containing gas, and the Ti/TiN layer is etched after the gradient OE process is performed on the remainder of the Al layer using the chlorine-containing gas and the fluorine-containing gas.

10. The method of manufacturing the metal interconnection line of claim 4, wherein the photoresist layer has a thickness of 3 μm to 6 μm, and wherein the patterned photoresist layer has a minimum line width and pitch both of 1 μm and a height-to-width aspect ratio of 4:1.

11. The method of manufacturing the metal interconnection line of claim 6, wherein after the gaseous volatile HCl and the byproducts from the reactions that occur in the gradient OE process are removed using the extraction pump, and before the wafer is soaked in the $NH_4F$ solution, the method of manufacturing the metal interconnection line further comprising: completely removing a patterned photoresist layer that is formed before the Al layer is etched.

12. A metal interconnection line made in accordance with the method of manufacturing the metal interconnection line of claim 1.

* * * * *